United States Patent
Huang et al.

(10) Patent No.: US 12,013,619 B2
(45) Date of Patent: Jun. 18, 2024

(54) METHODS FOR FORMING THIN FILM TRANSISTORS ON A GLASS SUBSTRATE AND LIQUID CRYSTAL DISPLAYS FORMED THEREFROM

(71) Applicant: CORNING INCORPORATED, Corning, NY (US)

(72) Inventors: Ming-Huang Huang, Ithaca, NY (US); Robert Bumju Lee, Horseheads, NY (US); Rajesh Vaddi, Corning, NY (US); Bin Zhu, Ithaca, NY (US)

(73) Assignee: CORNING INCORPORATED, Corning, NY (US)

(*) Notice: Subject to any disclaimer, the term of this patent is extended or adjusted under 35 U.S.C. 154(b) by 856 days.

(21) Appl. No.: 17/040,073

(22) PCT Filed: Mar. 26, 2019

(86) PCT No.: PCT/US2019/023984
§ 371 (c)(1),
(2) Date: Sep. 22, 2020

(87) PCT Pub. No.: WO2019/191031
PCT Pub. Date: Oct. 3, 2019

(65) Prior Publication Data
US 2021/0018780 A1  Jan. 21, 2021

Related U.S. Application Data

(60) Provisional application No. 62/648,581, filed on Mar. 27, 2018.

(51) Int. Cl.
*G02F 1/1368* (2006.01)
*H01L 29/786* (2006.01)

(52) U.S. Cl.
CPC ...... *G02F 1/1368* (2013.01); *H01L 29/78681* (2013.01); *G02F 1/13685* (2021.01)

(58) Field of Classification Search
None
See application file for complete search history.

(56) References Cited

U.S. PATENT DOCUMENTS

2006/0046335 A1    3/2006   Sarma et al.
2013/0285061 A1*  10/2013   Shukla ................. H10K 10/471
                                                                          438/479

(Continued)

FOREIGN PATENT DOCUMENTS

CN      104022158 A      9/2014
KR  10-2012-0118566 A   10/2012

(Continued)

OTHER PUBLICATIONS

Korean Patent Application No. 10-2020-7029845, Office Action dated Jul. 3, 2023, 8 pages (English Translation only), Korean Patent Office.

(Continued)

*Primary Examiner* — Phu Vu
(74) *Attorney, Agent, or Firm* — Svetlana Z. Short

(57) ABSTRACT

A thin film transistor (TFT) liquid crystal display (LCD) comprises a plurality of image pixels demarcated between an overlying liquid crystal display layer and an underlying glass substrate. Each image pixel comprises a dedicated top-gate TFT disposed over the glass substrate. Each top-gate thin film transistor comprises a process sensitive semiconductor layer disposed over the glass substrate, and a source electrode and a drain electrode disposed over the process sensitive semiconductor layer. The process sensitive semiconductor layer forms a process sensitive semiconductor active layer between the source electrode and the drain electrode and an active layer protection film is disposed over (Continued)

the process sensitive semiconductor active layer. A gate dielectric layer is disposed over the active layer protection film between the source electrode and the drain electrode and a gate electrode is disposed over the gate dielectric layer.

20 Claims, 6 Drawing Sheets

(56) References Cited

U.S. PATENT DOCUMENTS

| | | | |
|---|---|---|---|
| 2014/0131698 A1* | 5/2014 | Kim | H01L 29/78681 257/42 |
| 2016/0122229 A1 | 5/2016 | Bowden et al. | |
| 2016/0308006 A1 | 10/2016 | Kang et al. | |
| 2017/0153515 A1 | 6/2017 | Kim et al. | |
| 2017/0242533 A1 | 8/2017 | Liu et al. | |
| 2017/0261675 A1 | 9/2017 | Dannoux et al. | |
| 2017/0344145 A1 | 11/2017 | Lo et al. | |
| 2018/0004044 A1 | 1/2018 | Nolan et al. | |

FOREIGN PATENT DOCUMENTS

| | | |
|---|---|---|
| KR | 10-1376732 B1 | 4/2014 |
| KR | 10-2014-0062884 A | 5/2014 |
| KR | 10-2017-0061734 A | 6/2017 |
| TW | 201721863 A | 6/2017 |
| WO | 2015/119385 A1 | 8/2015 |

OTHER PUBLICATIONS

Taiwanese Patent Application No. 108110657, Office Action, dated Nov. 14, 2022, 1 page; Taiwanese Patent Office.

International Search Report and Written Opinion of the International Searching Authority; PCT/US2019/023984; dated Jul. 9, 2019; 12 Pages; Korean Intellectual Property Office.

Kang et al., "High-mobility three-atom-thick semiconducting films with wafer-scale homogeneity". Nature. Apr. 30, 2015;520 (7549), pp. 656-660.

* cited by examiner

METHODS FOR FORMING THIN FILM TRANSISTORS ON A GLASS SUBSTRATE AND LIQUID CRYSTAL DISPLAYS FORMED THEREFROM

CROSS-REFERENCE TO RELATED APPLICATIONS

This application claims the benefit of priority under 35 U.S.C. § 371 of International Application No. PCT/US2019/023984, filed on Mar. 26, 2019, which claims the benefit of priority of U.S. Provisional Application Ser. No. 62/648,581 filed on Mar. 27, 2018 the contents of which are relied upon and incorporated herein by reference in their entirety and if fully set forth below.

BACKGROUND

Field

The present specification generally relates to a method of forming thin film transistors and, more specifically, a method of forming liquid crystal displays with thin film transistors on a glass substrate.

Technical Background

Liquid crystal displays (LCDs) are generally flat panel displays that use the light-modulating properties of liquid crystals to provide desired images. Typical LCD applications include computer monitors, televisions, instrument panels, indoor and outdoor signage, and the like. An LCD includes a plurality of color pixels and each color pixel typically includes a layer of liquid crystals between a pair of electrodes and a pair of polarizing filters. The pair of polarizing filters are aligned perpendicular to each other and a mode of light propagating through one of the polarizing filters is rotated by the liquid crystals such that the light can pass through the other polarizing filter. Particularly, a transistor is used to apply a voltage across the pair of electrodes and the applied voltage rotates or de-rotates the liquid crystals such that light passing through one of the polarizing filters either passes through or does not pass through the other polarizing filter. In this manner each color pixel of the LCD can be turned "On" or "Off" and have a desired color, thereby providing desired images for viewing.

SUMMARY

Future ubiquitous smart electronic systems are envisioned with arbitrary form factors, robust elasticity, high speed charge transport, and low-power consumption, and such smart electronic systems will need to be integrated on environmentally friendly flexible substrates. One challenge for future smart electronic systems is the choice of a semiconductor material suitable for high-performance field-effect transistors (FETs) on a flexible substrate. Organic materials and amorphous silicon have been widely explored but their carrier mobilities (typically ≤1 $cm^2$/V·s) are too low for high-speed transistors operating at nanosecond cycles. Graphene has also attracted substantial interest for high-performance flexible electronics due to its high carrier mobility (>10,000 $cm^2$/V·s) and radio frequency properties. However, graphene does not have a bandgap. Accordingly, graphene's use for low-power switching or digital transistors appears unrealistic and other atomic layered sheet materials with substantial bandgaps have been investigated. One such class of materials is the semiconducting transition metal dichalcogenides (TMDs). For example molybdenum disulfide ($MoS_2$) has a large semiconducting bandgap (~1.8 eV for monolayer and ~1.3 eV for bulk films) which is ideal for low-power electronics on hard and soft substrates. Also, $MoS_2$ has a high carrier mobility (up to 200 $cm^2$/V·s at room temperature), high strength, and a large surface to volume ratio, all of which make $MoS_2$ a compelling semiconductor nanomaterial for high speed flexible transistors and sensors. However, monolayers of $MoS_2$ are sensitive (i.e., prone to damage) to semiconductor device patterning techniques such as oxygen plasma. Accordingly, current $MoS_2$ TFTs have been fabricated using e-beam photolithography utilizing $MoS_2$ flakes which have been transferred on a $SiO_2$/Si substrate thereby limiting the fabrication of $MoS_2$ TFTs to one device at a time. In contrast, methods of forming a plurality TFTs on a glass substrate using semiconductor device manufacturing techniques and liquid crystal displays with the plurality of TFTs are disclosed herein.

In one embodiment, a thin film transistor (TFT) liquid crystal display (LCD) comprises a plurality of image pixels demarcated between an overlying liquid crystal display layer and an underlying glass substrate. Each image pixel comprises a dedicated top-gate TFT disposed over the glass substrate. Each top-gate thin film transistor comprises a process sensitive semiconductor active layer disposed over the glass substrate, and a source electrode and a drain electrode disposed over the process sensitive semiconductor active layer. An active layer protection film is disposed over the process sensitive semiconductor active layer and a gate dielectric layer is disposed over the active layer protection film. In some embodiments, the process sensitive semiconductor active layer is a 2D semiconductor active layer formed from a transition metal dichalcogenide (TMD) semiconductor material. In other embodiments, the process sensitive semiconductor active layer is formed from an organic semiconductor material. In embodiments where the process sensitive semiconductor active layer is a 2D semiconductor active layer formed from the TMD semiconductor material, the TMD semiconductor material may be $MoS_2$, $WS_2$, $WSe_2$, or a combination thereof. In embodiments, where the process sensitive semiconductor active layer is formed from the organic semiconductor material, the organic semiconductor material may phenyl-C61-butyric acid methyl ester (PCBM), pentacene, a carbazole compound, phthalocyanine, e-poly(vinylidene fluoride-hexafluoropropylene) (e-PVDF-HFP), or a combination thereof. The active layer protection film may be a nitride film, an oxide film, or a combination thereof. For example, the active layer protection film may be formed from SiNx, $SiO_2$, $Al_2O_3$, $HfO_2$, or a combination thereof, and have a thickness between about 5 nm and about 20 nm. Also, the gate dielectric layer may be formed from SiNx, $SiO_2$, $Al_2O_3$, $HfO_2$, a combination thereof, a polyimide compound, or poly(tetrathienoacene-diketopyrrolopyrrole) (PTDPPTFT4). The source electrode and the drain electrode may be formed from Ti, Cu, Al, Mo, or a combination thereof.

In another embodiment, a panel for a LCD comprises a glass substrate and a plurality of top-gate TFTs disposed over the glass substrate. Each of the plurality of top-gate TFTs include a process sensitive semiconductor active layer disposed over the glass substrate, and a source electrode and a drain electrode disposed over the process sensitive semiconductor active layer. An active layer protection film is disposed over the process sensitive semiconductor active layer and a gate dielectric layer is disposed over the active layer protection film. In some embodiments, the process sensitive semiconductor active layer is a 2D semiconductor active layer formed from a TMD semiconductor material. In other embodiments, the process sensitive semiconductor active layer is formed from an organic semiconductor material. In embodiments where the process sensitive semiconductor active layer is formed from the TMD semiconductor material, the TMD semiconductor material may be $MoS_2$, $WS_2$, $WSe_2$, or a combination thereof. In embodiments, where the process sensitive semiconductor active layer is formed from the organic semiconductor material, the organic semiconductor material may phenyl-C61-butyric acid methyl ester (PCBM), pentacene, a carbazole compound, phthalocyanine, e-poly(vinylidene fluoride-hexafluoropropylene) (e-PVDF-HFP), or a combination thereof. The active layer protection film may be a nitride film, an oxide film, or a combination thereof. For example, the active layer protection film may be formed from SiNx, $SiO_2$, $Al_2O_3$, $HfO_2$, or a combination thereof, and have a thickness between about 5 nm and about 20 nm. Also, the gate dielectric layer may be formed from SiNx, $SiO_2$, $Al_2O_3$, $HfO_2$, a combination thereof, a polyimide compound, or poly(tetrathienoacene-diketopyrrolopyrrole) (PTDPPTFT4). The source electrode and the drain electrode may be formed from Ti, Cu, Al, Mo, or a combination thereof.

In yet another embodiment, a process for fabricating a plurality of top-gate TFTs comprises forming a process sensitive semiconductor layer on a glass substrate using high temperature chemical vapor deposition and forming a first metal layer on an upper surface of the process sensitive semiconductor layer. The first metal layer is patterned to form an array of electrode pair units on the process sensitive semiconductor layer. Each of the electrode pair units comprises a source electrode, a drain electrode spaced apart from the source electrode, and a process sensitive semiconductor active layer extending between the source electrode and the drain electrode. A protective film is formed on the array of electrode pair units, and the process sensitive semiconductor layer and the protective film are patterned to from an array of active layer/electrode pair units on the glass substrate. Each of the active layer/electrode pairs comprises an active layer protection film on the process sensitive semiconductor active layer extending between the source electrode and the drain electrode. The active layer protection film protects the process sensitive semiconductor active layer extending between the source electrode and the drain electrode during patterning of the process sensitive semiconductor layer. A dielectric layer is formed on the array of active layer/electrode pair units and forms a gate dielectric layer over the active layer protection film extending between the source electrode and the drain electrode for each of the active layer/electrode pair units. The dielectric layer is patterned and removed from the source electrode and the drain electrode for each of the active layer/electrode pair units. A second metal layer is formed on the array of active layer/electrode pair units and the second metal layer is patterned to from a contact pad on the source electrode, a contact pad on the drain electrode, and a top-gate electrode on the gate dielectric layer for each of the active layer/electrode pair units. In embodiments, the process sensitive semiconductor layer is patterned photolithographically and etched with an oxygen plasma. The active layer protection film may be formed from an oxide and the active layer protection film protects the process sensitive semiconductor active layer for each of the active layer/electrode pair units from oxygen plasma damage during etching of the process sensitive semiconductor layer. In some embodiments, the process sensitive semiconductor active layer is a 2D semiconductor active layer formed from a TMD semiconductor material. In other embodiments, the process sensitive semiconductor active layer is formed from an organic semiconductor material. In embodiments where the process sensitive semiconductor active layer is formed from the TMD semiconductor material, the TMD semiconductor material may be $MoS_2$, $WS_2$, $WSe_2$, or a combination thereof. In embodiments, where the process sensitive semiconductor active layer is formed from the organic semiconductor material, the organic semiconductor material may phenyl-C61-butyric acid methyl ester (PCBM), pentacene, a carbazole compound, phthalocyanine, e-poly(vinylidene fluoride-hexafluoropropylene) (e-PVDF-HFP), or a combination thereof. The active layer protection film may be a nitride film, an oxide film, or a combination thereof. For example, the active layer protection film may be formed from SiNx, $SiO_2$, $Al_2O_3$, $HfO_2$, or a combination thereof, and have a thickness between about 5 nm and about 20 nm. Also, the gate dielectric layer may be formed from SiNx, $SiO_2$, $Al_2O_3$, $HfO_2$, a combination thereof, a polyimide compound, or poly(tetrathienoacene-diketopyrrolopyrrole) (PTDPPTFT4). The source electrode and the drain electrode may be formed from Ti, Cu, Al, Mo, or a combination thereof.

Additional features and advantages will be set forth in the detailed description which follows, and in part will be readily apparent to those skilled in the art from the description or recognized by practicing the embodiments as described in the written description and claims hereof, as well as the appended drawings.

It is to be understood that both the foregoing general description and the following detailed description are merely exemplary, and are intended to provide an overview or framework to understand the nature and character of the claims. The accompanying drawings are included to provide a further understanding, and are incorporated in and constitute a part of this specification. The drawings illustrate one or more embodiments, and together with the description serve to explain principles and operation of the various embodiments.

DETAILED DESCRIPTION

Figure 1:
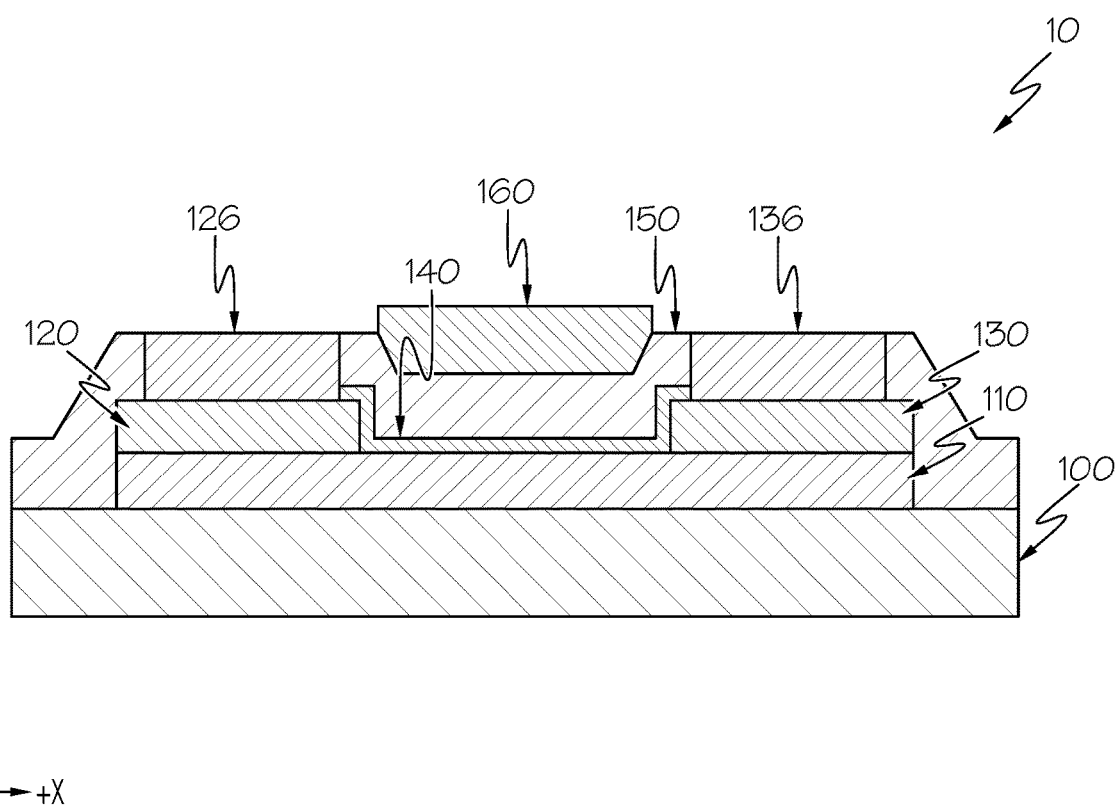
FIG. 1 schematically depicts a side view of a thin film transistor according to one or more embodiments described herein.

Referring to FIG. 1, a top-gate thin film transistor (TFT) 10 comprises a process sensitive semiconductor active layer 110 disposed over a glass substrate, a source electrode 120, a drain electrode 130, and an active layer protection film disposed over the process sensitive semiconductor active layer 110. As used herein, the phrases "process sensitive semiconductor layer" and "process sensitive semiconductor active layer" refer to semiconductor layers sensitive to oxygen plasma patterning or etching; the phrase "oxygen plasma" refers to a plasma treatment performed while introducing oxygen to the plasma chamber; and the phrase "active layer" refers to a semiconductor layer through which electrical current flows from a source electrode to a drain electrode. The process sensitive semiconductor active layer 110 extends between the source electrode 120 and the drain electrode 130 and a process sensitive semiconductor active layer protection film 140 (referred to herein simply as an "active layer protection film") is disposed over the process sensitive semiconductor active layer 110. A gate dielectric layer 150 is disposed over the active layer protection film 140 and a gate electrode 160 is disposed over the gate dielectric layer 150. The active layer protection film 140 protects the underlying process sensitive semiconductor active layer 110 during manufacturing of the top-gate TFT 10, particularly during patterning of the process sensitive semiconductor active layer 110, thereby increasing the performance of the process sensitive semiconductor active layer 110 during operation of the top-gate TFT 10.

Figure 2:
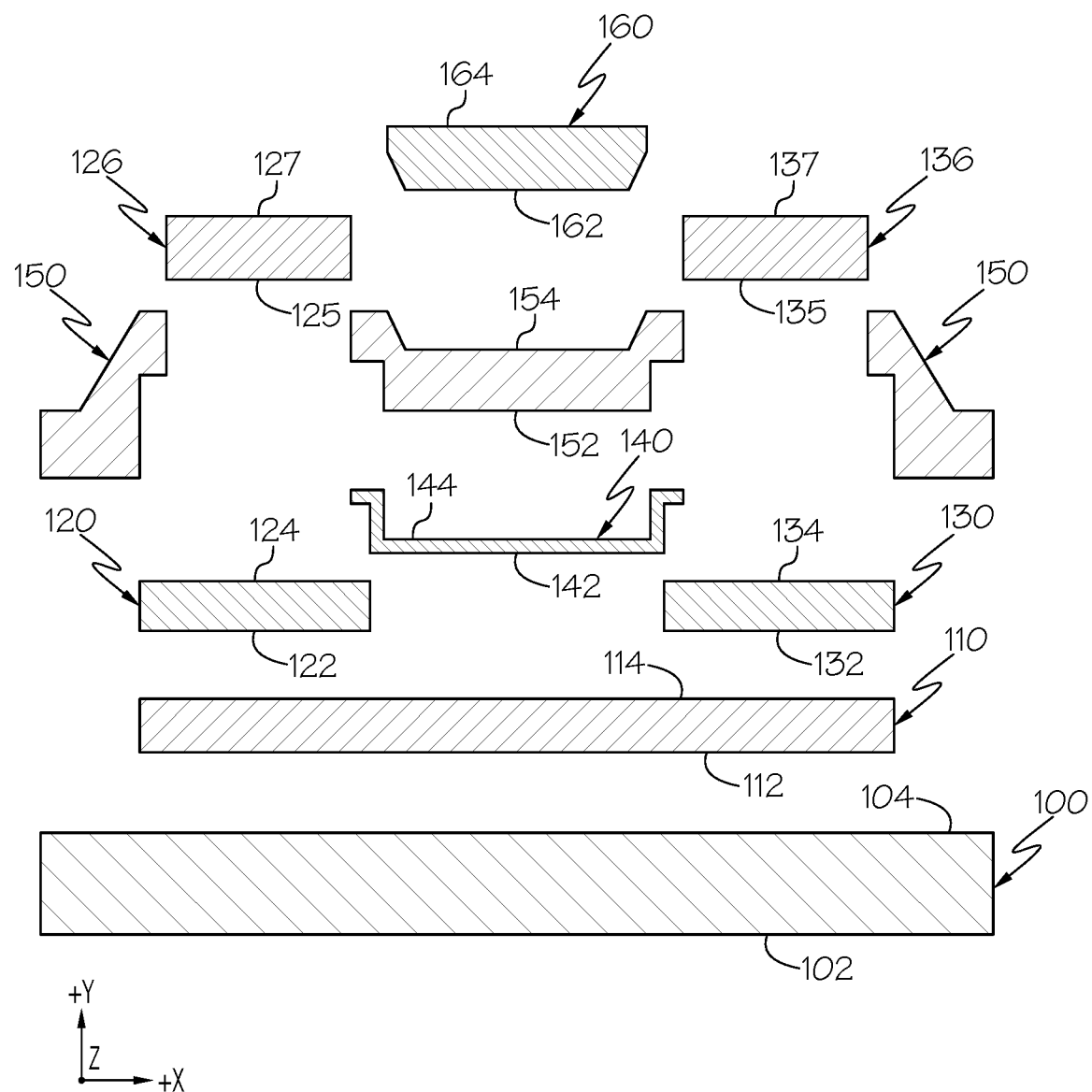
FIG. 2 schematically depicts an exploded view of the thin film transistor in FIG. 1.
Figure 3A:
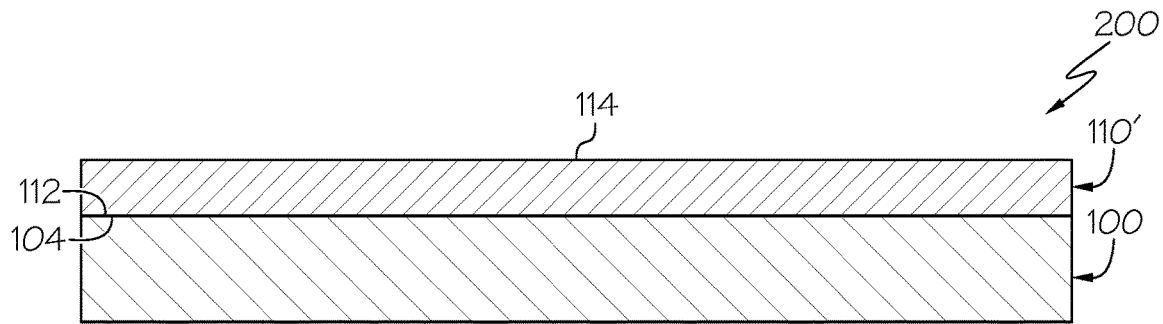
FIGS. 3A-3F schematically depict process steps for forming a thin film transistor according to one or more embodiments described herein.
Figure 3B:
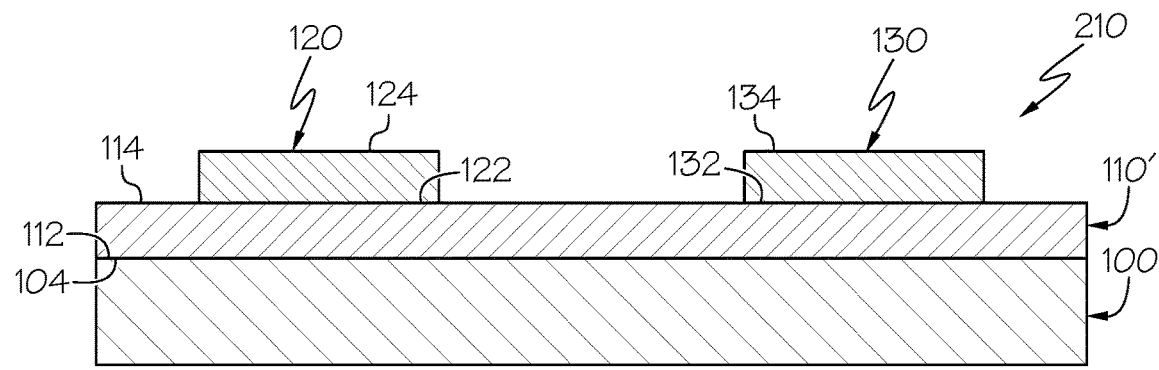
Figure 3C:
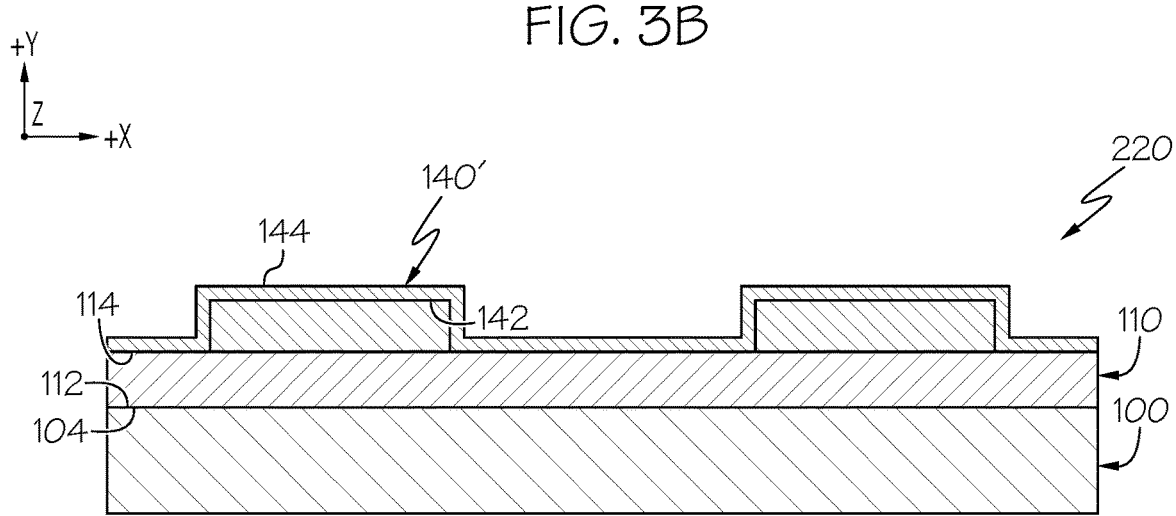
Figure 3D:
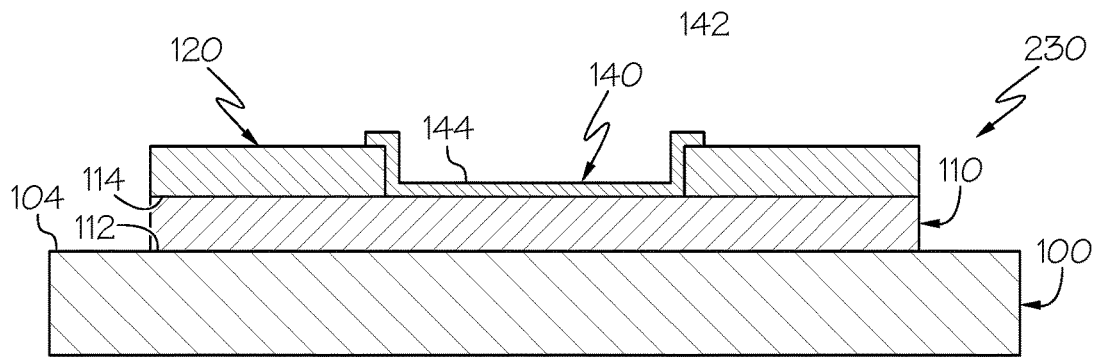
Figure 3E:
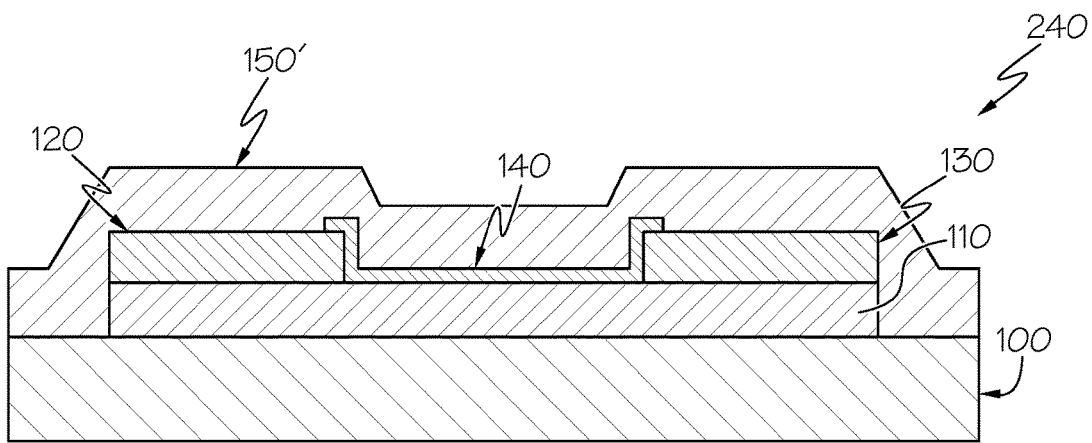
Figure 3F:
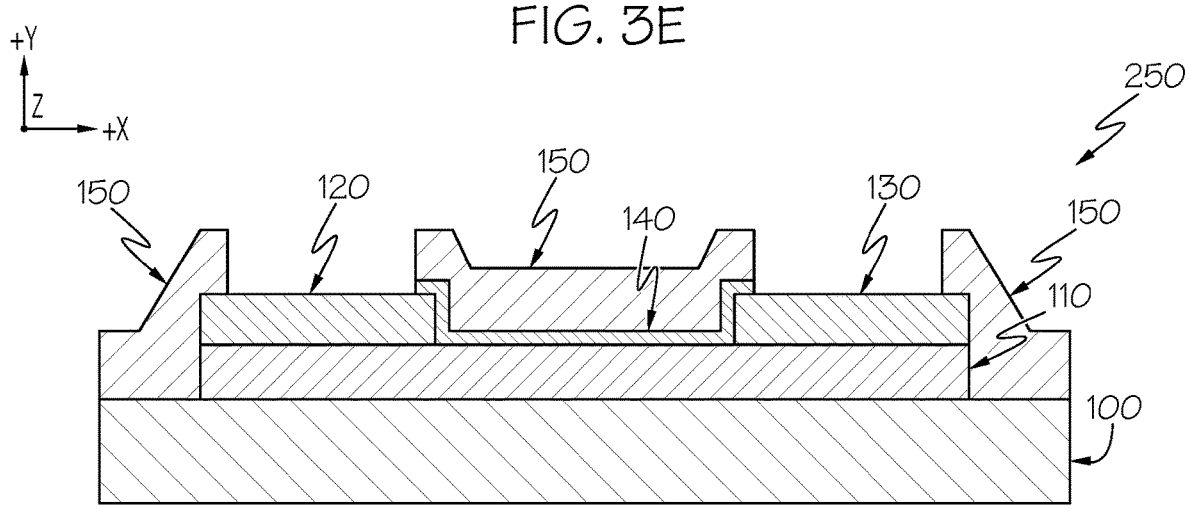

Referring now to FIGS. 1 and 2, a side cross sectional view of the top-gate TFT 10 is schematically depicted in FIG. 1 and an exploded view of the top-gate TFT 10 in FIG. 1 is schematically depicted in FIG. 2. The top-gate TFT 10 comprises a glass substrate 100 with a lower surface 102 (−Y direction) and an upper surface 104 (+Y direction). A process sensitive semiconductor active layer 110 with a lower surface 112 and an upper surface 114 is disposed over the glass substrate 100. In some embodiments, the process sensitive semiconductor active layer 110 is disposed on the glass substrate 100. As used herein, the phrase "disposed over" refers to a first component (e.g., the process sensitive semiconductor active layer 110) positioned over a second component (e.g., the glass substrate 100) with one or more layers optionally positioned between the first component and the second component. Also, the phrase "disposed on" refers to a first component (e.g., the process sensitive semiconductor active layer 110) positioned over and in direct contact with a second component (e.g., the glass substrate 100), i.e., one or more layers are not positioned between the first component and the second component. A source electrode 120 with a lower surface 122 and an upper surface 124, and a drain electrode 130 with a lower surface 132 and an upper surface 134, are disposed over the process sensitive semiconductor active layer 110. The drain electrode 130 is spaced apart (X direction) from the source electrode 120 and the process sensitive semiconductor active layer 110 extends between the source electrode 120 and the drain electrode 130. In some embodiments, the process sensitive semiconductor active layer 110 is sandwiched between the source electrode 120 and the glass substrate 100 and between the drain electrode 130 and the glass substrate 100. In other embodiments, the process sensitive semiconductor active layer 110 is sandwiched directly between the source electrode 120 and the glass substrate 100 and between the drain electrode 130 and the glass substrate 100 as depicted in FIG. 1. As used herein, the phrase "sandwiched between" refers to a first component (e.g., the process sensitive semiconductor active layer 110) positioned between a second component (e.g., the source electrode 120) and a third component (e.g., the glass substrate 100) with one or more layers optionally positioned between the first component and the second component and/or between the first component and the third component. Also, the phrase "sandwiched directly between" as used herein refers to a first component positioned between and in direct contact with a second component and a third component, i.e., one or more layers are not between the first component and the second component and/or between the first component and the third component. Accordingly, in embodiments where the process sensitive semiconductor active layer 110 is sandwiched directly between the source electrode 120 and the glass substrate 100 and between the drain electrode 130 and the glass substrate 100, the lower surface 122 of the source electrode 120 and the lower surface 132 of the drain electrode 130 are in direct contact with the upper surface 114 of the process sensitive semiconductor active layer 110 as depicted in FIG. 1.

Still referring to FIGS. 1 and 2, an active layer protection film 140 with a lower surface 142 and an upper surface 144 may be disposed over the process sensitive semiconductor active layer 110 extending between the source electrode 120 and the drain electrode 130. In embodiments, the active layer protection film 140 may be disposed on the process sensitive semiconductor active layer 110. A gate dielectric layer 150 may be disposed over the active layer protection film 140 and a gate electrode 160 may be disposed over the gate dielectric layer 150. The gate electrode 160 is spaced from the source electrode 120, the drain electrode 130 and the process sensitive semiconductor active layer 110. For example, the gate dielectric layer 150 may be disposed between the gate electrode 160 and the source electrode 120, disposed between the gate electrode 160 and the drain electrode 130, and disposed between the gate electrode 160 and the process sensitive semiconductor active layer 110. Disposed over the source electrode 120 and the drain electrode 130 are a source electrode contact pad 126 and a drain electrode contact pad 136, respectively. The source electrode contact pad 126 has a lower surface 125 and an upper surface 127, and the drain electrode contact pad 136 has a lower surface 135 and an upper surface 137. In embodiments, the source electrode contact pad 126 and/or the drain electrode contact pad 136 are disposed on the source electrode 120 and the drain electrode 130, respectively. It should be understood that the gate dielectric layer 150 electrically insulates the gate electrode 160 from the source electrode 120 and the drain electrode 130.

The thicknesses of the glass substrate 100, process sensitive semiconductor active layer 110, source electrode 120, source electrode contact pad 126, drain electrode 130, drain electrode contact pad 136, active layer protection film 140, gate dielectric layer 150, and gate electrode 160 may depend on the intended use of the top-gate TFT 10. In one embodiment, the glass substrate 100 has a thickness (Y direction) within the range of about 0.1 millimeters (mm) and about 1.0 mm; the process sensitive semiconductor active layer 110 has a thickness within the range of about 0.2 nanometers (nm) and about 1.0 nm; the source electrode 120 and the drain electrode 130 each have a thickness within the range of about 50 nm and about 250 nm; the source electrode contact pad 126 and the drain electrode contact pad 136 each have a thickness between about 100 nm and about 500 nm; the active layer protection film 140 has a thickness between about 5 nm and about 25 nm; the gate dielectric layer 150 has thickness directly above (+Y direction) the active layer protection film 140 extending over the process sensitive semiconductor active layer 110 between about 10 nm and about 50 nm; and the gate electrode 160 has a thickness between about 100 nm and about 500 nm. In one non-limiting example, the glass substrate 100 may have a thickness (Y direction) of about 0.3 mm; the process sensitive semiconductor active layer 110 may have a thickness of about 0.5 nm; the source electrode 120 and the drain electrode 130 may each have a thickness of about 100 nm; the source electrode contact pad 126 and the drain electrode contact pad 136 may each have a thickness of about 250 nm; the active layer protection film 140 may have a thickness of about 10 nm; the gate dielectric layer 150 may have thickness directly above (+Y direction) the active layer protection film 140 extending over the process sensitive semiconductor active layer 110 of about 20 nm; and the gate electrode 160 may have a thickness of about 200 nm. It should be understood that other thicknesses may be utilized.

The glass substrate 100 may be formed from glass such as alkali-free borosilicate glass as disclosed in US Patent Application Publication No. 2016/0122229, alkaline earth boro-aluminosilicate glass such as commercial glasses available under the names Corning Lotus™ NXT Glass and Corning EAGLE XG® Slim Glass, and the like. The process sensitive semiconductor active layer 110 may be a 2D semiconductor active layer formed from a transition metal dichalcogenide (TMD) semiconductor material such as molybdenum disulfide ($MoS_2$), tungsten disulfide ($WS_2$), tungsten diselenide ($WSe_2$), and the like. In the alternative, the process sensitive semiconductor active layer 110 may be formed from an organic semiconductor material such as phenyl-C61-butyric acid methyl ester (PCBM), pentacene, a carbazole compound, phthalocyanine, e-poly(vinylidene fluoride-hexafluoropropylene) (e-PVDF-HFP), and the like. The source electrode 120, the source electrode contact pad 126, the drain electrode 130, the drain electrode contact pad 136, and the gate electrode 160 may be formed from metallic materials such as copper (Cu), titanium (Ti), aluminum (Al), molybdenum (Mo), combinations thereof, alloys thereof, and the like. As used herein, the phrase "combinations thereof" refers to a combination of items listed. One non-limiting example of a source electrode 120, and other electrodes described herein, formed from a combination of Ti and Cu comprises an electrode formed from a layer of Ti and a layer of Cu disposed on the layer of Ti. Also, the phrase "alloys thereof" as used herein does not limit alloys formed from only the elements listed unless stated otherwise. For example, the source electrode 120, and other electrodes described herein, may be formed from alloys of Cu with elemental additions other than or in addition to Ti, Al, and/or Mo, and the like. In the alternative, the source electrode 120, and other electrodes described herein, may be formed from alloys containing only Cu and Ti, Al, and/or Mo, and possibly incidental impurities present resulting from the manufacture of Cu—Al alloys, Cu—Ti alloys, etc. The active layer protection film 140 may be formed from an oxygen plasma resistant material such as a nitride, an oxide, or combinations thereof. As used herein, the phrase "oxygen plasma" refers to a plasma treatment performed while introducing oxygen to the plasma chamber. Non-limiting examples of oxygen plasma resistant materials include $Al_2O_3$, SiNx, $SiO_2$, $HfO_2$, combinations thereof, and the like. In embodiments, the active layer protection film 140 may be an $Al_2O_3$ active layer protection film 140. The gate dielectric layer 150 may be formed from inorganic dielectric materials such as SiNx, $SiO_2$, $Al_2O_3$, $HfO_2$, and the like. In the alternative, the gate dielectric layer 150 may be formed from organic dielectric materials such as polyimide compounds, poly(tetrathienoacene-diketopyrrolopyrrole) (PTDPPTFT4), and the like.

Referring now to FIGS. 3A-3F, a process for making the top-gate TFT 10 is schematically depicted. At step 200 (FIG. 3A) a process sensitive semiconductor layer 110' is formed on the glass substrate 100. The glass substrate 100 may be an alkali-free borosilicate glass or alkaline earth boro-aluminosilicate glass as discussed above. In some embodiments, the glass substrate 100 may be a roll of alkali-free borosilicate glass or alkaline earth boro-aluminosilicate glass that is unrolled and passed through a thin film deposition chamber for the deposition of the process sensitive semiconductor layer 110'. In other embodiments, the glass substrate 100 may be a sheet alkali-free borosilicate glass or alkaline earth boro-aluminosilicate glass onto which a plurality of top-gate TFTs 10 are formed. The process sensitive semiconductor layer 110' may be formed on the glass substrate using a 2D layer forming technique. Non-limiting examples of 2D layer forming techniques include atomic layer deposition (ALD) techniques such as chemical vapor deposition (CVD), high temperature CVD, physical vapor deposition, and the like. As used herein, the phrase "high temperature CVD" refers to CVD at temperatures greater than about 500° C. In some embodiments, the process sensitive semiconductor layer 110' is formed directly on the glass substrate 100. In such embodiments, the process sensitive semiconductor layer 110' may be a 2D $MoS_2$ semiconductor layer formed by high temperature CVD at a temperature greater than 500° C. using precursors of molybdenum oxide ($MoO_3$) and sulfur vapor. It should be understood that the process sensitive semiconductor layer 110' may be formed continuously over a large area of the glass substrate 100. As used herein, the term "large area" refers to an area greater than about 10 $cm^2$. In some embodiments, the process sensitive semiconductor layer 110' is a continuous process sensitive semiconductor layer with a surface area greater than about 100 $cm^2$. For example, the process sensitive semiconductor layer 110' may be a continuous process sensitive semiconductor layer with a surface area greater than about 200 $cm^2$.

At step 210 (FIG. 3B), the source electrode 120 and the drain electrode 130 are deposited and patterned on the process sensitive semiconductor layer 110'. The source electrode 120 and the drain electrode 130 may be formed using a thin film deposition technique illustratively including CVD, high temperature CVD, PVD, and the like. In some embodiments, the source electrode 120 and the drain electrode 130 are formed using a PVD technique such as electron beam evaporation (also known as electron beam PVD or EBPVD) of one or more metals. For example, the source electrode 120 and the drain electrode 130 may be formed with a combination of a first metal layer and a second metal layer. The source electrode 120 and the drain electrode 130 may be patterned using a patterning technique. Non-limiting examples of patterning techniques include photolithography, shadow masking, lift-off patterning, dry etching (also known as plasma etching) including reactive-ion etching and deep reactive-ion etching, wet etching (also known as chemical etching), combinations thereof, and the like. In some embodiments, the source electrode 120 and the drain electrode 130 are patterned using a lift-off process.

At step 220 (FIG. 3C), a protection film 140' with a lower surface 142 and an upper surface 144 is deposited onto the source electrode 120, the drain electrode 130 and the process sensitive semiconductor layer 110' extending between (and beyond) the source electrode 120 and the drain electrode 130. The protection film 140' may be deposited using an ALD deposition technique illustratively including CVD, high temperature CVD, PVD, and the like.

At step 230 (FIG. 3D), the process sensitive semiconductor layer 110' and the protection film 140' are patterned to form the process sensitive semiconductor active layer 110 extending between the source electrode 120 and the drain electrode 130, and to form the active layer protection film 140 disposed over the process sensitive semiconductor active layer 110. The process sensitive semiconductor layer 110' and the protection film 140' may be patterned using a patterning technique. Non-limiting examples of patterning techniques utilized to pattern the process sensitive semiconductor layer 110' and the protection film 140' include photolithography, shadow masking, lift-off patterning, dry etching, wet etching, combinations thereof, and the like. In some embodiments, the process sensitive semiconductor layer 110' and the protection film 140' are patterned photolithographically with a photoresist mask, an $Al_2O_3$ etching solution, and oxygen plasma etching. In such embodiments, photoresist on the protection film 140' may be removed with an oxygen plasma without the oxygen plasma contacting and/or damaging the process sensitive semiconductor layer 110' underneath the protection film 140'. Also, removal of the residual photoresist on the protection film 140' may enhance or improve contact between the dielectric layer 150' deposited onto the active layer protection film 140 at step 240 schematically depicted in FIG. 3E. Particularly, at step 240 a dielectric layer 150' is formed on the source electrode 120, the drain electrode 130, and the active layer protection film 140 extending between the source electrode 120 and the drain electrode 130. It should be understood that the dielectric layer 150' may be formed on the glass substrate 100 extending past (+X and -X direction) the process sensitive semiconductor active layer 110. The dielectric layer 150' may be formed on the source electrode 120, the drain electrode 130, and the active layer protection film 140 using a thin film forming technique. Non-limiting examples of thin film forming techniques include atomic layer deposition (ALD) techniques such as chemical vapor deposition (CVD), high temperature CVD, PVD, and the like.

At step 250 (FIG. 3F), the dielectric layer 150' is patterned to form the gate dielectric layer 150 and remove the dielectric layer 150' from the source electrode 120 and the drain electrode 130. The dielectric layer 150' may be patterned photolithographically with photoresist masking and reactive ion etching.

A second metal layer (not shown) may be deposited and patterned to form the source electrode contact pad 126, the drain electrode contact pad 136 and the gate electrode 160 as depicted in FIG. 1. The source electrode contact pad 126, the drain electrode contact pad 136 and the gate electrode 160 may be formed using a thin film deposition technique illustratively including CVD, high temperature CVD, PVD, and the like. In some embodiments, the source electrode 120 and the drain electrode 130 are formed using a EBPVD of one or more metals. The source electrode contact pad 126, the drain electrode contact pad 136 and the gate electrode 160 may be formed with a combination of a first metal layer and a second metal layer. Also, the source electrode contact pad 126, the drain electrode contact pad 136 and the gate electrode 160 may be patterned using a patterning technique such as photolithography, shadow masking, lift-off patterning, dry etching, wet etching, combinations thereof, and the like. In some embodiments, the source electrode 120 and the drain electrode 130 are patterned using a lift-off process.

Figure 4:
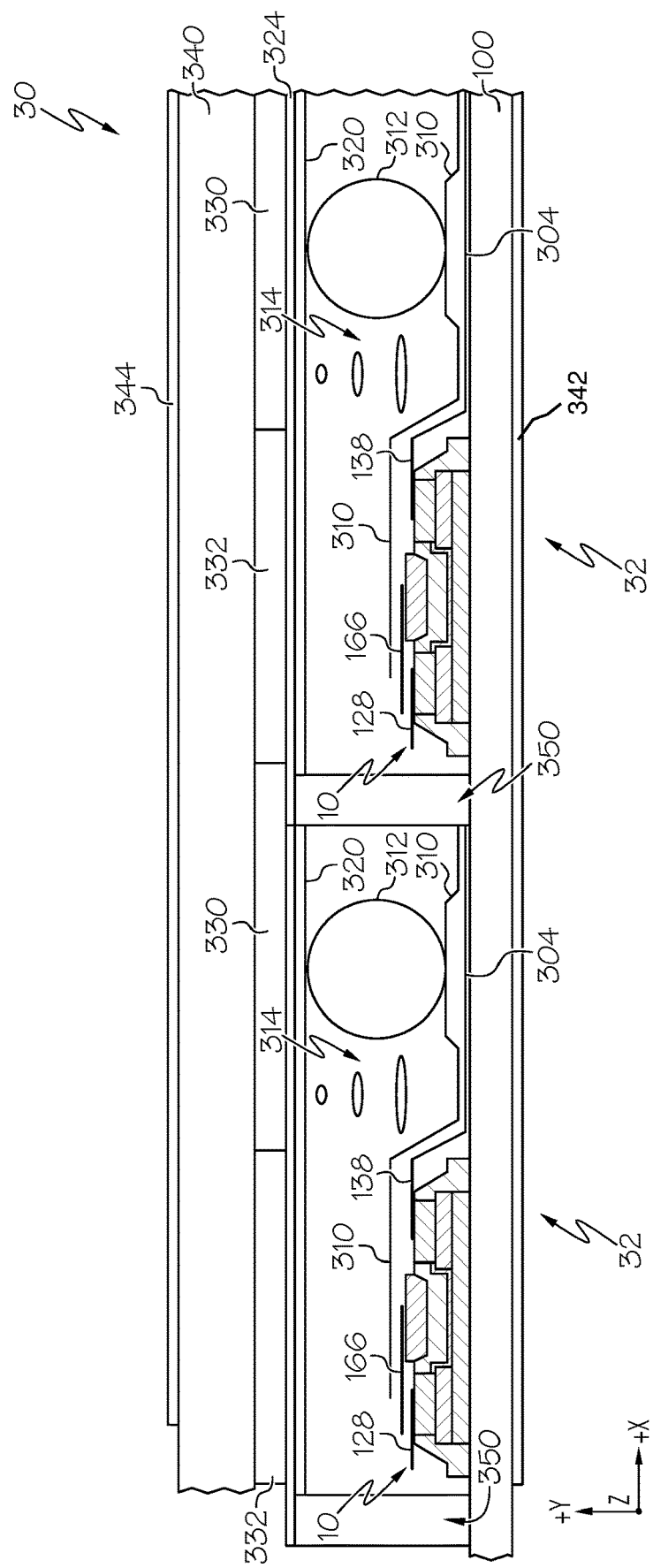
FIG. 4 schematically depicts a side view section of a liquid crystal display according to one or more embodiments described herein.

Turning now to FIG. 4, a non-limiting example of a liquid crystal display (LCD) 30 comprising a plurality of top-gate TFTs 10 is schematically depicted. The LCD 30 comprises a plurality of image pixels 32 demarcated between an overlying liquid crystal display layer 340 and an underlying glass substrate 100. A seal 350 may be positioned between each of the image pixels 32. Each of the image pixels 32 comprises a dedicated top-gate TFT 10 disposed over the glass substrate 100. In embodiments, each of the top-gate TFTs 10 may be disposed on the glass substrate 100 with a plurality of process sensitive semiconductor active layers 110 (FIG. 1) disposed on the glass substrate 100. Each of the top-gate TFTs 10 include the source electrode 120, the drain electrode 130 and the process sensitive semiconductor active layer 110 disposed between the source electrode 120 and the glass substrate 100, disposed between the drain electrode 130 and the glass substrate 100, and extending between the source electrode 120 and the drain electrode 130. The active layer protection film 140 is disposed over the process sensitive semiconductor active layer 110 extending between the source electrode 120 and the drain electrode 130, and a gate dielectric layer 150 is disposed over the active layer protection film 140. In embodiments, the active layer protection film 140 is disposed on the process sensitive semiconductor active layer 110. A source electrode contact pad 126 is disposed over the source electrode 120, a drain electrode contact pad 136 is disposed over the drain electrode 130, and a gate electrode 160 is disposed over the gate dielectric layer 150.

A source electrode conductive lead 128 may be disposed over and in electrical contact with the source electrode contact pad 126, a drain electrode conductive lead 138 may be disposed over and in electrical contact with the drain electrode contact pad 136, and a gate electrode conductive lead 166 may be disposed over and in electrical contact with the gate electrode 160. Positioned between each of the top-gate TFTs 10 and a spacer 312 is a liquid crystal 314. A lower alignment layer 310 is positioned between the liquid crystal 314 and a pixel electrode 304 that is in electrical contact with and extends from the drain electrode conductive lead 138. That is, the pixel electrode 304 extends from the top-gate TFT 10 to underneath (-Y direction) the liquid crystal 314. Extending above (+Y direction) the liquid crystal 314 is a common electrode 324. Positioned between the common electrode 324 and the liquid crystal 314 is an upper alignment layer 320.

Still referring to FIG. 4, a first polarization film 342 may be disposed over a lower surface 102 (FIG. 2) of the glass substrate 100 and a second polarization film 344 may be disposed over the overlying liquid crystal display layer 340 as depicted in FIG. 4. A plurality of color filters 330 (e.g., red, blue and green color filters; only one shown) are disposed between the overlying liquid crystal display layer 340 and the common electrode 324 for each of the image pixels 32. In some embodiments, a black matrix layer 332 that generally blocks light may be positioned over (+Y direction) the top-gate TFT 10 between the overlying liquid crystal display layer 340 and the common electrode 324 for each of the image pixels 32. In other embodiments, the top-gate TFT 10 may be transparent to light and the black matrix layer 332 may be replaced with a red, blue or green color filter 330. It should be understood that in embodiments where the top-gate TFT 10 is transparent to light and the black matrix layer 332 is replaced with a color filter 330, such a transparent top-gate TFT may increase the aperture ratio of the LCD 30 and improve the display quality thereof.

In operation, the plurality of top-gate TFTs 10 are used to apply a potential between the pixel electrode 304 and the common electrode 324 such that the liquid crystals 314 either rotate or de-rotate so that light propagating through the first polarization film 342 may pass through the second polarization film 344 and each image pixel 32 of the LCD 30 has a desired color.

While FIG. 4 schematically depicts one example of an overlying LCD, the present disclosure is not limited to an overlying liquid crystal display layer of one particular type and that any of a variety of conventional or yet-to-be developed technologies may be employed to form the overlying liquid crystal display layer including for example, and not by way of limitation, the liquid crystal display layer illustrated in FIG. 4, which comprises a liquid crystal matrix, an alignment layer, a common ITO electrode, a black matrix material, color filter elements, a glass display surface, a polarizing filter, the associated spacers arranged in the interior of the display, and suitable shorting and sealing elements. Further examples of suitable liquid crystal display layers are illustrated in US Patent Application Publication Nos. 2018/0004044, 2017/0261675, and 2017/0153515. Similarly, it is noted that the TFT structures contemplated herein may be utilized in a variety of suitable conventional, or yet-to-be developed, pixel configurations, one of which is illustrated in FIG. 4 and comprises a dedicated storage capacitor and bonding pad for electrical coupling to an associated display driver. For example, and not by way of limitation, examples of suitable electrical configurations for TFT LCD display pixels are illustrated in US Patent Application Publication Nos. 2017/0344145 and 2017/0242533.

EXAMPLES

Comparative Example

A top-gate TFT without an active layer protection film disposed on a process sensitive semiconductor layer was manufactured for testing. Particularly, a 2D $MoS_2$ semiconductor layer was formed directly on an alkaline earth boro-aluminosilicate glass substrate using high temperature CVD with precursors of $MoO_3$ and sulfur vapor, and a deposition temperature of about 680° C. A source electrode and a drain electrode each comprising a 10 nm Ti layer and a 100 nm Cu layer were formed on the 2D $MoS_2$ semiconductor layer using EBPVD and lift-off patterning. Photoresist used for the lift-off patterning was not subjected to ion bombardment and was easily removed. The 2D $MoS_2$ semiconductor layer was patterned photolithographically and etched using an $Ar+O_2$ plasma to form the 2D $MoS_2$ semiconductor active layer extending between the source electrode and the drain electrode. The source electrode and the drain electrode provided a hard mask on and protect the 2D $MoS_2$ semiconductor layer beneath the electrodes during etching. The photoresist was stripped with MICROPOSIT™ Remover 1165 after etching, however the photoresist deteriorated during the $Ar+O_2$ plasma etching of the 2D $MoS_2$ semiconducting layer thereby resulting in residual photoresist remaining on the 2D $MoS_2$ semiconductor layer the source electrode and the drain electrode as observed with scanning electron microscopy. An $Al_2O_3$ dielectric layer with a thickness of 30 nm was deposited over the source electrode, the drain electrode and the patterned 2D $MoS_2$ semiconductor layer at 200° C. using an ALD system. However, the residual photoresist on the 2D $MoS_2$ semiconductor active layer resulted in a stripe pattern between the 2D $MoS_2$ semiconductor active layer and the $Al_2O_3$ dielectric layer. That is, the residual photoresist prevented a clean interface between the 2D $MoS_2$ semiconductor active layer and the $Al_2O_3$ dielectric layer. The $Al_2O_3$ dielectric layer was patterned photographically and etched using a $BCl_3+Ar$ plasma and the photoresist was stripped using an $Ar+O_2$ plasma. A source electrode contact pad, a drain electrode contact pad and a top-gate electrode comprising 10 nm Ti layer and a 100 nm Cu layer were deposited using EBPVD and patterned with a lift-off process.

Example

A top-gate TFT with an active layer protection film disposed on a process sensitive semiconductor layer was manufactured for testing. Particularly, a 2D $MoS_2$ semiconductor layer was formed directly on an alkaline earth boro-aluminosilicate glass substrate using high temperature CVD with precursors of $MoO_3$ and sulfur vapor, and a deposition temperature of about 680° C. A source electrode and a drain electrode each comprising a 10 nm Ti layer and a 100 nm Cu layer were formed on the 2D $MoS_2$ semiconductor layer using EBPVD and lift-off patterning. The photoresist used for the lift-off patterning was not subjected to ion bombardment and was easily removed. An $Al_2O_3$ active layer protection film with a thickness of 10 nm was deposited onto the source electrode, the drain electrode, and the 2D $MoS_2$ semiconductor layer at 200° C. using an ALD system. The $Al_2O_3$ active layer protection film and the 2D $MoS_2$ semiconductor layer were patterned photolithographically and etched using an $Ar+O_2$ plasma to form the 2D $MoS_2$ semiconductor active layer extending between the source electrode and the drain electrode. The source electrode, the drain electrode and the $Al_2O_3$ active layer protection film provided a hard mask on and protected the 2D $MoS_2$ semiconductor layer during etching. Also, the $Al_2O_3$ active layer protection film allowed for an $Ar+O_2$ plasma to be used to remove residual photoresist without damaging the 2D $MoS_2$ semiconductor layer. An $Al_2O_3$ dielectric layer with a thickness of 20 nm was deposited over the source electrode, the drain electrode and the $Al_2O_3$ active layer protection film at 200° C. using an ALD system. The $Al_2O_3$ dielectric layer was patterned photographically and etched using a $BCl_3+Ar$ plasma and the photoresist was stripped using an $Ar+O_2$ plasma. A source electrode contact pad, a drain electrode contact pad and a top-gate electrode comprising 10 nm Ti layer and a 100 nm Cu layer were deposited using EBPVD and patterned with a lift-off process.

Figure 5:
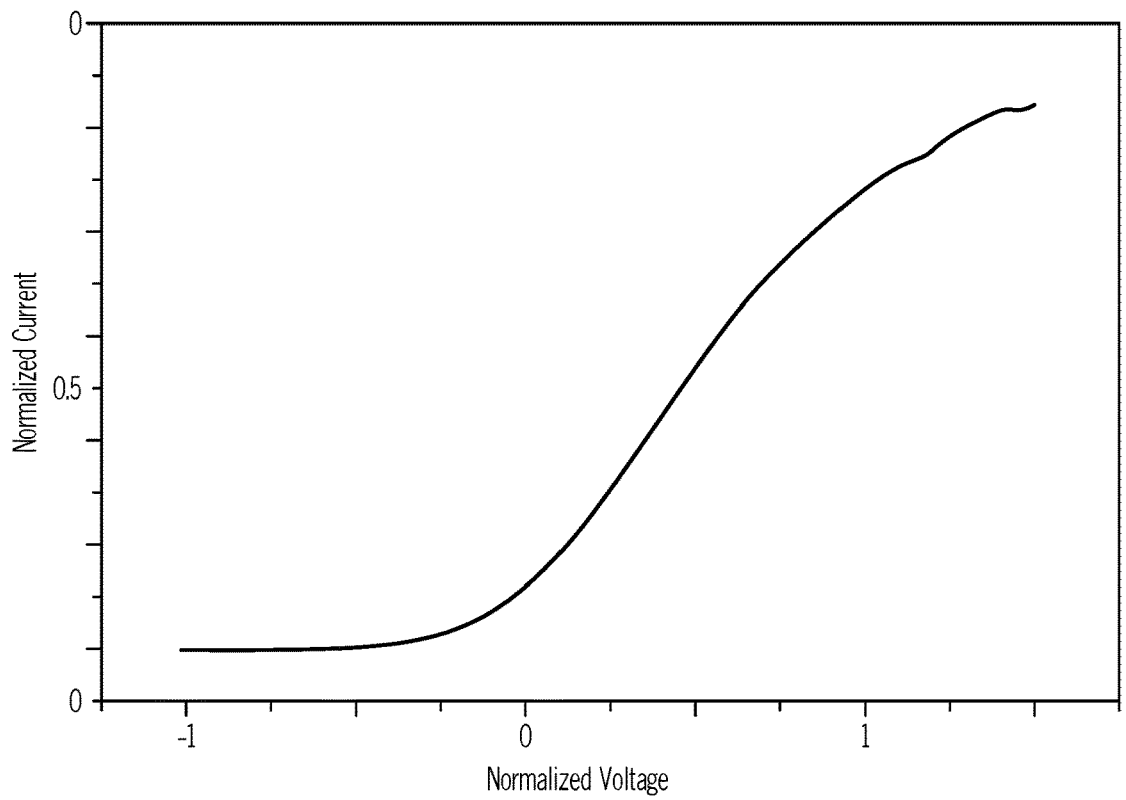
FIG. 5 graphically depicts Normalized Voltage versus Normalized Current for a top-gate TFT without an active layer protection film.
Figure 6:
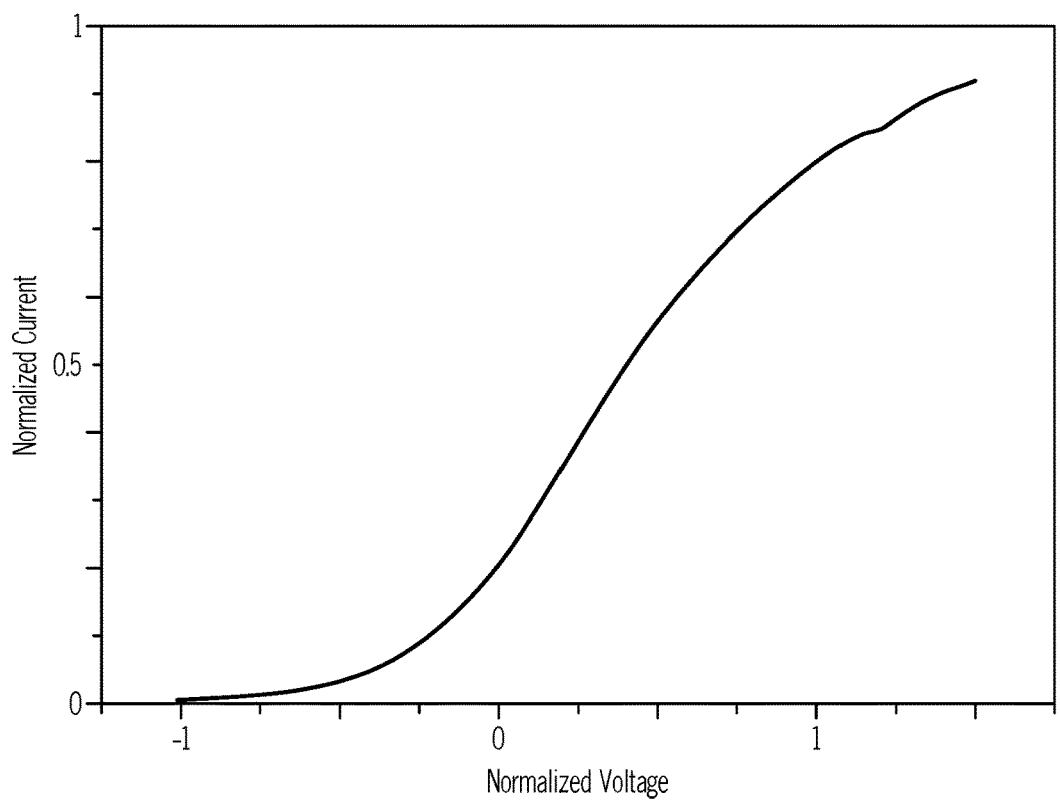
FIG. 6 graphically depicts Normalized Voltage versus Normalized Current for a top-gate TFT with the active layer protection film according to one or more embodiments described herein.

Referring now to FIGS. 5 and 6, the top-gate TFT without an active layer protection film and the top-gate TFT with an active layer protection film were subjected to threshold voltage testing. As used herein, the phrase "threshold voltage" refers to the minimum gate electrode-to-source electrode voltage differential needed to create a conducting path between the source electrode and the drain electrode of a top-gate TFT. FIG. 5 graphically depicts Normalized Voltage (X axis) versus Normalized Current (Y axis) for the top-gate TFT without the active layer protection film and FIG. 6 graphically depicts Normalized Voltage versus Normalized Current for the top-gate TFT with the active layer protection film. The normalized voltage threshold for the top-gate TFT without the active layer protection film was about −0.34 volts (V) and the normalized voltage threshold for the top-gate TFT with the active layer protection film was about −0.5 V. Accordingly, the top-gate TFT with the active layer protection film exhibited an approximate 48% decrease in voltage threshold compared to the top-gate TFT without the active layer protection film. Also, the drain current saturation (not shown in figures) for the top-gate TFT with the active layer protection film was about 55 times greater than the drain current saturation for the top-gate TFT without the active layer protection film. As used herein, the phrase "drain current saturation" refers to the maximum amount of current carried by the drain electrode of a top-gate TFT when the gate electrode and source electrode voltage equals 0.0 V.

Because the top-gate TFTs described herein use an active layer protection film to protect a process sensitive semiconductor active layer from oxygen plasma etching, oxygen plasma etching may be to remove residual photoresist on the process sensitive semiconductor active layer, the integrity of the process sensitive semiconductor active layer is preserved, and the performance of the top-gate TFTs is increased. Accordingly, active layer protection films disclosed and described herein provide for materials sensitive to patterning techniques (e.g., oxygen plasma etching) to be used as process sensitive semiconductor active layers between source electrodes and drain electrodes. Also, the methods for forming top-gate TFTs disclosed and described herein allow for semiconductor device manufacturing techniques typically used to form a plurality of top-gate TFTs directly on a glass substrate to be used to form LCDs with process sensitive process sensitive semiconductor active layers and thereby provide economically feasible processes for the manufacture of LCDs with improved TFTs (e.g., top-gate TFTs with 2D $MoS_2$ semiconductor active layers).

In the above detailed description, numerous specific details have been set forth in order to provide a thorough understanding of embodiments described above. However, it will be clear to one skilled in the art when embodiments may be practiced without some or all of these specific details. In other instances, well-known features or processes may not be described in detail so as not to unnecessarily obscure the disclosure. Moreover, unless otherwise defined, all technical and scientific terms used herein have the same meaning as commonly understood by one of ordinary skill in the art to which this disclosure belongs. In case of conflict, the present specification, including the definitions herein, will control.

Although other methods and can be used in the practice or testing of the embodiments described herein, certain suitable methods and materials are described herein.

Disclosed are materials, compounds, compositions, and components that can be used for, can be used in conjunction with, can be used in preparation for, or are embodiments of the disclosed method and compositions. These and other materials are disclosed herein, and it is understood that when combinations, subsets, interactions, groups, etc. of these materials are disclosed that while specific reference of each various individual and collective combinations and permutation of these compounds may not be explicitly disclosed, each is specifically contemplated and described herein.

As used herein, the term "about" means that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art. In general, an amount, size, formulation, parameter or other quantity or characteristic is "about" or "approximate" whether or not expressly stated to be such.

The term "or", as used herein, is inclusive; more specifically, the phrase "A or B" means "A, B, or both A and B." Exclusive "or" is designated herein by terms such as "either A or B" and "one of A or B," for example.

The indefinite articles "a" and "an" are employed to describe elements and components of the invention. The use of these articles means that one or at least one of these elements or components is present. Although these articles are conventionally employed to signify that the modified noun is a singular noun, as used herein the articles "a" and "an" also include the plural, unless otherwise stated in specific instances. Similarly, the definite article "the", as used herein, also signifies that the modified noun may be singular or plural, again unless otherwise stated in specific instances.

It will be apparent to those skilled in the art that various modifications and variations can be made to the embodiments described herein without departing from the spirit and scope of the claimed subject matter. Thus it is intended that the specification cover the modifications and variations of the various embodiments described herein provided such modification and variations come within the scope of the appended claims and their equivalents.

The invention claimed is:

1. A thin film transistor liquid crystal display comprising a plurality of image pixels demarcated between an overlying liquid crystal display layer and an underlying glass substrate, wherein each image pixel comprises a dedicated top-gate thin film transistor disposed over the glass substrate and each top-gate thin film transistor comprises:
   a process sensitive semiconductor layer disposed over the glass substrate;
   a source electrode and a drain electrode disposed over the process sensitive semiconductor layer, wherein the process sensitive semiconductor layer forms a process sensitive semiconductor active layer between the source electrode and the drain electrode;
   an active layer protection film formed from an oxygen plasma resistant material disposed over the process sensitive semiconductor active layer and extending partially onto an upper surface of the source electrode and the drain electrode;
   a gate dielectric layer disposed over the active layer protection film between the source electrode and the drain electrode, wherein the active layer protection film is sandwiched between the process sensitive semiconductor active layer and the gate dielectric layer; and
   a gate electrode disposed over the gate dielectric layer.

2. The thin film transistor liquid crystal display of claim 1, wherein the process sensitive semiconductor layer is formed from at least one of a transition metal dichalcogenide (TMD) semiconductor material and an organic semiconductor material.

3. The thin film transistor liquid crystal display of claim 1, wherein the process sensitive semiconductor active layer is a 2D semiconductor active layer formed from a transition metal dichalcogenide (TMD) semiconductor material selected from at least one of $MoS_2$, $WS_2$, and $WSe_2$.

4. The thin film transistor liquid crystal display of claim 1, wherein the process sensitive semiconductor active layer is formed from an organic semiconductor material comprising at least one of phenyl-C61-butyric acid methyl ester (PCBM), pentacene, a carbazole compound, phthalocyanine, and e-poly(vinylidene fluoride-hexafluoropropylene) (e-PVDF-HFP).

5. The thin film transistor liquid crystal display of claim 1, wherein the active layer protection film comprises SiNx, $SiO_2$, $Al_2O_3$, $HfO_2$, or a combination thereof.

6. The thin film transistor liquid crystal display of claim 1, wherein the active layer protection film comprises an $Al_2O_3$ film with a thickness between about 5 nm and about 20 nm.

7. The thin film transistor liquid crystal display of claim 1, wherein the gate dielectric layer comprises at least one of SiNx, SiO$_2$, Al$_2$O$_3$, HfO$_2$, a polyimide compound, and poly(tetrathienoacene-diketopyrrolopyrrole) (PTDPPTFT4).

8. The thin film transistor liquid crystal display of claim 1, wherein the source electrode and the drain electrode comprise Ti, Cu, Al, and Mo.

9. A panel for a liquid crystal display comprising:
a glass substrate and a plurality of top-gate thin film transistors disposed over the glass substrate, wherein each of the plurality of top-gate thin film transistors comprises:
a process sensitive semiconductor layer disposed over the glass substrate;
a source electrode and a drain electrode disposed over the process sensitive semiconductor layer, wherein the process sensitive semiconductor layer forms a process sensitive semiconductor active layer between the source electrode and the drain electrode;
an active layer protection film formed from an oxygen plasma resistant material disposed over the process sensitive semiconductor active layer and extending partially onto an upper surface of the source electrode and the drain electrode;
a gate dielectric layer disposed over the active layer protection film between the source electrode and the drain electrode, wherein the active layer protection film is sandwiched between the process sensitive semiconductor active layer and the gate dielectric layer; and
a gate electrode disposed over the gate dielectric layer.

10. The panel of claim 9, wherein the process sensitive semiconductor active layer is formed from at least one of a transition metal dichalcogenide (TMD) semiconductor material and an organic semiconductor material.

11. The panel of claim 9, wherein the process sensitive semiconductor active layer is a 2D semiconductor active layer formed from a transition metal dichalcogenide (TMD) semiconductor material comprising at least one of MoS$_2$, WS$_2$, and WSe$_2$.

12. The panel of claim 9, wherein the process sensitive semiconductor active layer is formed from an organic semiconductor material comprising at least one of phenyl-C61-butyric acid methyl ester (PCBM), pentacene, a carbazole compound, phthalocyanine, and e-poly(vinylidene fluoride-hexafluoropropylene) (e-PVDF-HFP).

13. The panel of claim 9, wherein the active layer protection film comprises SiNx, SiO$_2$, Al$_2$O$_3$, HfO$_2$, or a combination thereof.

14. The panel of claim 9, wherein the active layer protection film comprises an Al$_2$O$_3$ film.

15. The panel of claim 9, wherein the gate dielectric layer comprises at least one of SiNx, SiO$_2$, Al$_2$O$_3$, HfO$_2$, a polyimide compound, and poly(tetrathienoacene-diketopyrrolopyrrole) (PTDPPTFT4).

16. A process for fabricating a plurality of top-gate thin film transistors comprising:
forming a process sensitive semiconductor layer on a glass substrate using high temperature chemical vapor deposition CVD;
forming a first metal layer on an upper surface of the process sensitive semiconductor layer;
patterning the first metal layer and the process sensitive semiconductor layer and forming an array of electrode pair units on the process sensitive semiconductor layer, wherein each of the electrode pair units comprises a source electrode and a drain electrode spaced apart from the source electrode, and a process sensitive semiconductor active layer extending between the source electrode and the drain electrode;
forming a protective film on the array of electrode pair units;
patterning the process sensitive semiconductor layer and the protective film and forming an array of active layer/electrode pair units on the glass substrate, wherein each of the active layer/electrode pair units comprises an active layer protection film on the process sensitive semiconductor active layer extending between the source electrode and the drain electrode, and the active layer protection film protects the process sensitive semiconductor active layer extending between the source electrode and the drain electrode during patterning of the process sensitive semiconductor layer;
forming a dielectric layer on the array of active layer/electrode pair units, wherein the dielectric layer forms a gate dielectric layer over the active layer protection film extending between the source electrode and the drain electrode for each of the active layer/electrode pair units;
patterning the dielectric layer and removing the dielectric layer from the source electrode and the drain electrode for each of the active layer/electrode pair units;
forming a second metal layer on the array of active layer/electrode pair units; and
patterning the second metal layer and forming a contact pad on the source electrode, a contact pad on the drain electrode, and a top-gate electrode on the gate dielectric layer for each of the active layer/electrode pair units.

17. The process of claim 16, wherein the process sensitive semiconductor layer is patterned with oxygen plasma patterning, the active layer protection film comprises an oxide, and the active layer protection film protects the process sensitive semiconductor active layer for each of the active layer/electrode pair units from oxygen plasma damage during patterning of the process sensitive semiconductor layer.

18. The process of claim 16, wherein the process sensitive semiconductor layer is formed from at least one of a transition metal dichalcogenide (TMD) semiconductor material and an organic semiconductor material.

19. The process of claim 16, wherein the process sensitive semiconductor active layer is a 2D semiconductor active layer formed from a transition metal dichalcogenide (TMD) semiconductor material selected from at least one of MoS$_2$, WS$_2$, and WSe$_2$.

20. The process of claim 16, wherein the active layer protection film comprises SiNx, SiO$_2$, Al$_2$O$_3$, HfO$_2$, or a combination thereof.

* * * * *